United States Patent [19]

Bardelang et al.

[11] Patent Number: 5,059,878
[45] Date of Patent: Oct. 22, 1991

[54] DEVICE FOR THE DYNAMIC MEASUREMENT OF THE TORQUE OF A SELF-SYNCHRONOUS MOTOR AND DEVICE FOR THE SERVO-CONTROL OF A SELF-SYNCHRONOUS MOTOR USING THIS DEVICE

[75] Inventors: Vianney Bardelang, Cormeilles en Parisis; Jacques Coeuillet, Dieulefit; Pascal Dubos, Louveciennes, all of France

[73] Assignee: Thomson-CSF, Puteaux, France

[21] Appl. No.: 544,931

[22] Filed: Jun. 28, 1990

[30] Foreign Application Priority Data

Jul. 7, 1989 [FR] France ................. 89 09173

[51] Int. Cl.[5] ............................. G01L 3/00
[52] U.S. Cl. .................. 318/490; 73/862.08
[58] Field of Search ............ 318/490, 432, 434, 700, 318/705, 721, 722, 723, 724; 73/862.08, 862.34

[56] References Cited

U.S. PATENT DOCUMENTS

| | | | |
|---|---|---|---|
| 3,980,950 | 9/1976 | Kutsevalov et al. | 318/490 X |
| 4,088,934 | 5/1978 | D'Atre et al. | 318/802 |
| 4,240,020 | 12/1980 | Okuyama et al. | 318/721 |
| 4,240,296 | 12/1980 | Kolodziej | 73/650 |
| 4,490,661 | 12/1984 | Brown et al. | |
| 4,651,068 | 3/1987 | Meshkat-Razavi | |
| 4,918,997 | 4/1990 | Pouillange | 73/862.34 |
| 4,991,429 | 2/1991 | Stacey et al. | 73/116 |

FOREIGN PATENT DOCUMENTS 0254310 1/1988 European Pat. Off. .

OTHER PUBLICATIONS

Conference Record Industry Applications Society, Oct. 6-11, 1985, pp. 790-797, H. Le-Huy et al., "Minimization of Torque Ripple in Brushless DC Motor Drives".
Proceedings IECON '87, Nov. 3-6, 1987, U.S., pp. 454-463, B. K. Bose et al., "A Microcomputer-Based Control and Simulation of an Advanced IPM Synchronous Machine Drive System for Electric Vehicle Propulsion".
Patent Abstracts of Japan, vol. 4, No. 32 (E-2)(514), Mar. 19, 1980, & JP-A-55 5012, Jan. 14, 1980, H. Itou, "Method of Controlling Speed of Brushless Motor".

Primary Examiner—Bentsu Ro
Attorney, Agent, or Firm—Oblon, Spivak, McClelland, Maier & Neustadt

[57] ABSTRACT

The device for the dynamic measurement of the torque $C_i$ of a polyphase self-synchronous motor comprises a sensor of the electrical angle between one of the phases and the axis perpedicular to the magnetic moment (APMM), circuits for the computation of the cosines of the angles (A, A−120°, A+120°) between each phase and the APMM, sensors of current on each phase, and means to compute the torque $C_i$ by application of the formula:

$$C_i = k[i1 \cdot \cos A + i2 \cdot \cos(A + 120°) + i3 \cdot \cos(A + 120°)]$$

5 Claims, 5 Drawing Sheets

DEVICE FOR THE DYNAMIC MEASUREMENT OF THE TORQUE OF A SELF-SYNCHRONOUS MOTOR AND DEVICE FOR THE SERVO-CONTROL OF A SELF-SYNCHRONOUS MOTOR USING THIS DEVICE

BACKGROUND OF THE INVENTION

1. Field of the Invention

The present invention pertains to a device for the dynamic measurement of the torque of a self-synchronous motor. It also pertains to a device for the servo-control of self-synchronous motor, this control device using this dynamic measurement device.

2. Description of the Prior Art

Self-synchronous motors are motors with a good power/weight ratio, that are ever more frequently being used to make servo-systems, where the tendency is for them to gradually replace the DC motors used up till now.

A self-synchronous motor has the same electromagnetic structure as a standard synchronous motor. Its rotor is generally formed by a permanent magnet while its stator is a polyphase stator, for example a three-phase stator, and consequently has three star-connected armature windings.

In fact, the resemblance with the synchronous motor stops here, for the mode of operation of a self-synchronous motor is quite another matter. It consists, in fact, in supplying the above-mentioned armature windings with currents so that the instantaneous magnetic field resulting from the combination of these currents is always perpendicular to the magnetic moment of the magnet forming the rotor or, in other words, parallel to the APMM (the Axis Perpendicular to the Magnetic Moment of the Magnet).

In the case of a three-phase configuration of the armature windings, it can easily be shown that this condition is achieved by supplying the first, second and third armature windings respectively with currents that are obtained by multiplying the signal, or parameter, for the control of the motor (often called the "controlled current") by a value proportional to respectively $\cos A$, $\cos (A+120°)$ and $\cos (A-120°)$, where A is the electrical angle between the first armature winding and the above-mentioned APMM.

FIG. 1 appended hereto shows a standard device for the control of a self-synchronous motor, by way of indication. In this figure, the references 1, 2 and 3 respectively represent the three three-phase stator windings of the self-synchronous motor, which are respectively crossed by the instantaneous currents i1, i2, i3.

The electrical angle A between APMM and the winding 1 is measured by a sensor 4, and it is applied respectively to the first three inputs 8, 9, 10 of computation circuits 5, 6, 7 which respectively receive a signal, equal to the control parameter, at their three second inputs, 14, 11, 12. This signal is called a "controlled current", Ic, and is applied to the control input 13 and multiplied by a standardization factor in a multiplier 112.

The circuit 5 computes $\cos A$ and multiplies it by the analog value of the signal at 14. The circuit 6 computes $\cos (A-120°)$ and multiplies it by the analog value of the signal at 11 and, in the same way, the circuit 7 computes $\cos (A+120°)$ and multiplies it by the analog value of the signal at 12. Analog voltages appear at the outputs 15, 16, 17 of these three circuits. These analog voltages are respectively proportional to $Ic.\cos A$, $Ic.\cos (A-120°)$ and $Ic.\cos (A+120°)$. This actually corresponds to the distribution desired for the three armature currents i1, i2 and i3.

These three analog voltages respectively drive three power amplifiers 18, 19 and 20 which themselves give the currents i1, i2 and i3 to the three-phase stator windings 1, 2 and 3.

A self-synchronous motor such as this has a great many advantages, obtained at a competitive cost:
high specific power;
high power ratio;
possibility of high speeds
smoothness of the low speeds;
long life;
easy maintenance.

By contrast, since these motors are polyphase AC machines there is no physically expressed signal, as there is in the armature current of the DC motors, which can be considered as a direct image of their electromagnetic torque. Now, in servo-systems, it is particularly useful to have a means available to check the torque at the motor shaft, and this check should be a high quality one.

For example, it is often necessary to:
attenuate the effect of the non-linearities of the amplifiers (including their thresholds);
restrict the maximum value of the torque applied to the load;
achieve the fidelity of the torque transfer function.

Moreover, as the technician does not have the image, in real time, of the electromagnetic torque of the self-synchronous motor, it is not possible for him, during the final adjustment tests in the laboratory, to perform measurements on this value and, in particular, to set up the torque transfer function.

It is all the more essential to resolve the problem of controlling the torque of a self-synchronous motor as these machines, owing to the non-negligible inductance of the stator windings, tend to set up a non-negligible opposing reactive impedance, this reaction being all the greater as the speed is high. This results in a reduction of the electromagnetic torque when the speed rises.

Indeed, since the electromagnetic torque of the self-synchronous motors is naturally equal to the vector product of the "rotating field" vector, created by the polyphase stator windings, and the "magnetic moment" vector of the rotor if, for example, the direction of the induction field created by these windings is adjusted so that, when the motor stops (zero speed), it is parallel to the APMM, the inductive phase shift created when the motor rotates in the stator windings, then necessarily produces a correlative phase shift of the above-mentioned induction field, so that this field stops being parallel to APMM. This causes a reduction in the torque, and this reduction varies as the cosine of the above-mentioned spatial phase shift angle.

Two methods are commonly used to combat this ill effect of the inductance of the armature windings:

A first method consists in achieving an "a priority compensation" which is done in real time as a function of the armature currents and the speed of rotation of the motor. With the value of the inductance of each stator winding being known, the method consists in the application to the stator winding, through the power amplifier associated with it, of an increase in voltage that is all the higher as the rotation speed of the motor is high, so as to compensate for the inductive voltage drops The drawback of this method is the lack of precision and the random phenomena inherent in this type of a priori compensation. Besides, this method in no way resolves the problem of checking the torque of the motor.

A second method, represented schematically by dots and dashes in the above-mentioned FIG. 1, consists in the association, with each power amplifier 18, 19, 20, of a current negative feedback loop, respectively 21 (negative feedback connection 24 and input subtractor 25), 22 (connection 26 and subtractor 27) and 24 (connection 28 and subtractor 29). Thus, a current servo-control is set up in each of the three phases. This other method, which is often combined with the first one, has the following drawbacks:

it does not guarantee perfect symmetry of the three amplification chains;

should there be damage to one of the three amplification chains, the motor suffers a very major deterioration in performance characteristics;

it cannot be used to obtain a real image of the torque, especially during the measurements for the final adjustments.

SUMMARY OF THE INVENTION

The invention seeks to overcome all these drawbacks. To this effect, it pertains to a device for the dynamic measurement of the torque of a self-synchronous motor that is fitted out with means to measure the instantaneous value of the current in each of the stator windings of this motor, means to measure the instantaneous value of the angle between the direction of the respective magnetic field, created in each of these windings, and the axis perpendicular to the magnetic moment (or APMM) of the magnet that forms the rotor of this motor, means to compute the cosine of each of these respective angles and to multiply this cosine by said instantaneous value of the corresponding stator current in order to thus obtain the arithmetical value of the projection, on said APMM, of the vector representing, in the electrical plane of the machine, this respective stator current and, finally, means to add up the arithmetical values of these projections thus obtained and to multiply the result obtained by a factor of proportionality making it possible, then, to obtain the instantaneous value of the electromagnetic torque of the motor.

BRIEF DESCRIPTION OF THE DRAWINGS

In any case, the invention will be clearly understood and its advantages and other characteristic will emerge from the following description of a non-restrictive exemplary embodiment of a three-phase self-synchronous motor, made with reference to the appended drawings, wherein.

DESCRIPTION OF PREFERRED EMBODIMENTS

Figure 2:
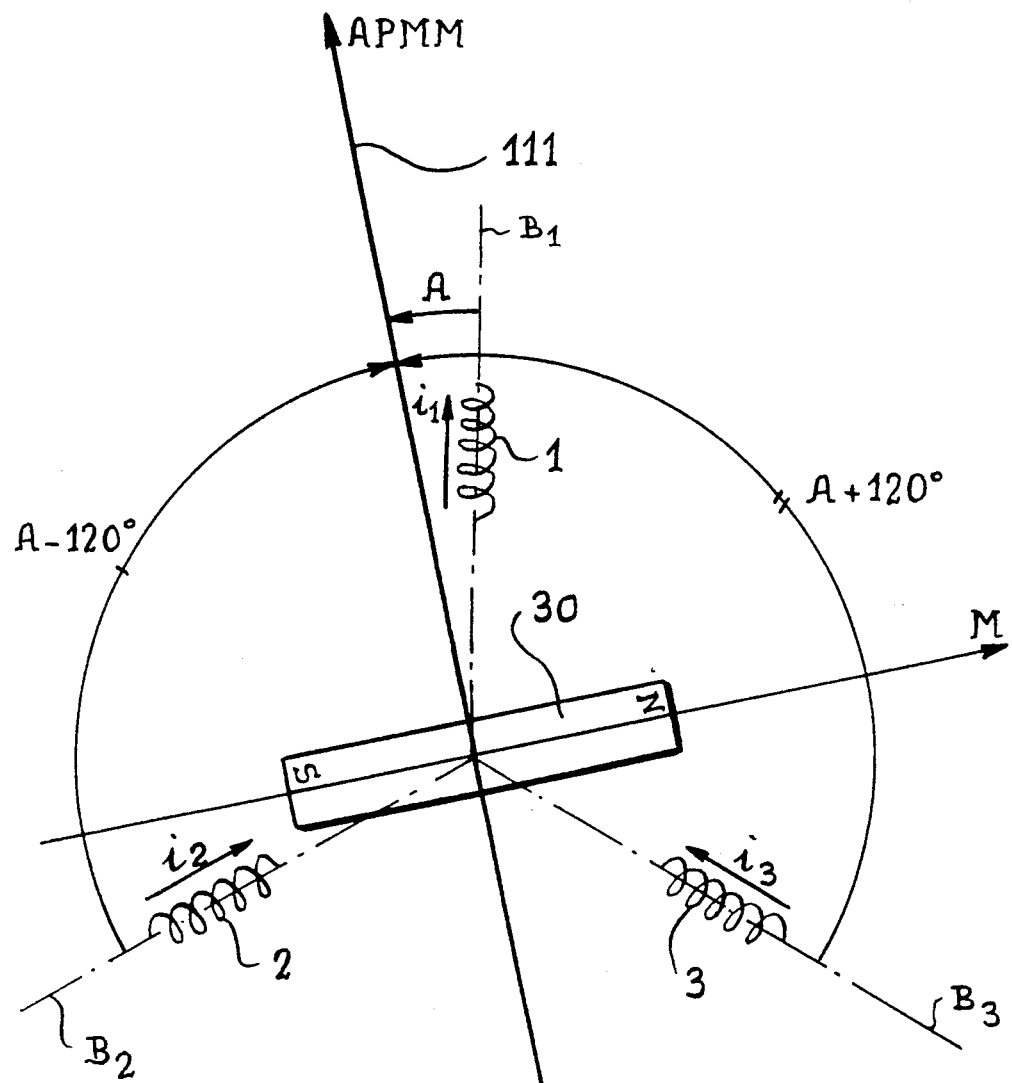
FIG. 2 is an explanatory diagram of the torque computation mode used in the present invention.

Referring to FIG. 2, three armature windings 1, 2, 3 are shown in the electrical plane of the three-phase self-synchronous motor. The axes B1, B2, B3 of these three armature windings, which give the direction of the three instantaneous magnetic fields, respectively created by the stator currents i1, i2 and i3, are at 120° with respect to one another.

The rotor of the motor is symbolically represented by a permanent magnet 30 with a magnetic moment M and the APMM, which by definition is the axis orthogonal to this magnetic moment M, is designated by the reference 111.

A being the angle between the direction B1 and the APMM 111, it follows that the angles between, respectively, B2 and B3, and this APMM are respectively equal to $(A-120°)$ and $(A+120°)$, as indicated in the drawing.

As is well known, the instantaneous torque vector C1, created by the current i1 flowing in the winding 1, is equal to the vector product of the "magnetic moment" vector of the magnet 30 by the "magnetic induction" vector generated by this current i1. Consequently, this torque C1 is proportional to the product of the arithmetical value of this current i1 by the cosine of the angle A between the direction B1 of the magnetic field created by the current i1 in the winding 1 and the direction of the APMM 111, that is:

$$C1 = k.i1.\cos A$$

where k is a factor of proportionality.

In the same way, the torque C2 due to the flow of the current i2 in the winding 2 is equal to:

$$C2 = k.i2.\cos(A-120°)$$

and the torque C3 due to the flow of the current i3 in the winding 3 is equal to:

$$C3 = k.i2.\cos(A+120°)$$

so that finally the arithmetical value of the instantaneous electromagnetic torque Ci on the shaft of the self-synchronous motor is given by the formula:

$$Ci = k[i1.\cos A + i2.\cos(A+120°) + i3.\cos(A+120°)]$$

It is precisely this formula that is used in the device for measuring this torque Ci which shall now be described with reference to FIG. 3.

Figure 3:
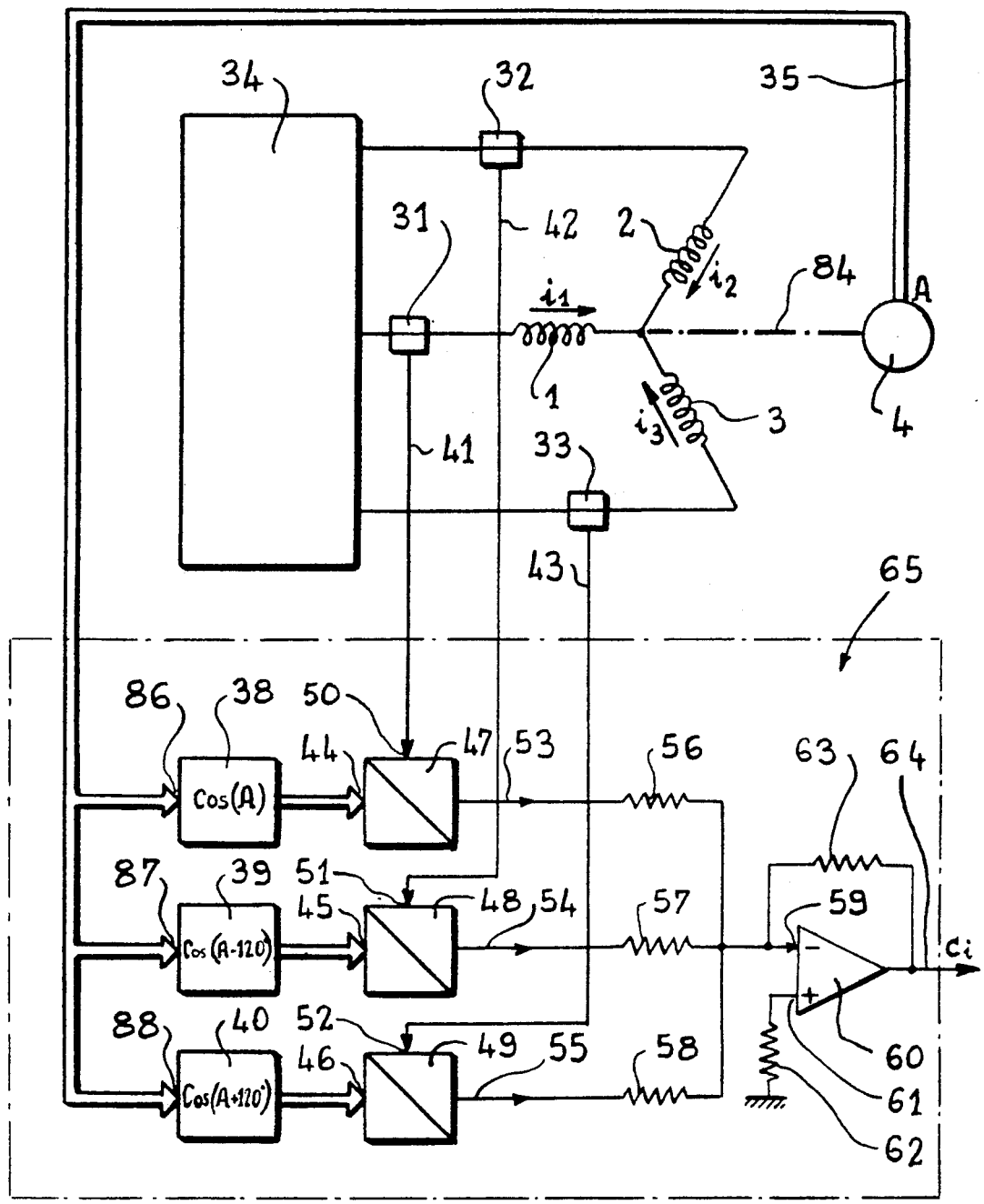
FIG. 3 is a simplified electrical diagram of this device for measuring the electromagnetic torque of a self-synchronous motor.

Referring, therefore, to this FIG. 3, the three stator windings of the self-synchronous motor, crossed by the currents i1, i2, i3 given by an electronic supply unit with the general reference 34, are designated here too by the references 1, 2 and 3. As is the case with the standard circuit of FIG. 1, the electronic unit 34 distributes the currents i1, i2 and i3 so that the electromagnetic field created by the three of them in the windings 1, 2 and 3 are always parallel to the above-mentioned APMM, at least for the low speeds.

Analog sensors of current, 31, 32, 33, that are respectively placed in series with the windings 1, 2 and 3, give analog values at their respective outputs 41, 42, 43. These analog values respectively represent the instantaneous arithmetical value of the currents i1, i2, i3.

A digital encoder 4, placed on the shaft 84 of the self-synchronous motor, gives a piece of digital information on its output bus 35. This piece of digital information represents the value of the angle A between the direction of the magnetic field of the winding 1 and the APMM of the motor (see FIG. 2).

This piece of digital information is respectively applied to the respective inputs 86, 87, 88 of three SGS2716 type integrated circuits 38, 39, 40 which are respectively programmed to carry out the digital computation of cos A, cos (A−120°), and cos (A+120°).

The outputs of these computation circuits 38, 39, 40 are respectively applied to three respective digital inputs, 44, 45, 46 of three AD7533 type integrated circuits 47, 48, 49 that receive, at their respective analog inputs, 50, 51, 52, the measurement outputs 41, 42, 43 of the above-mentioned current sensors 31, 32, 33. Each of these integrated circuits 47, 48, 49 multiplies the analog value of the current i1, i2, i3 applied to its analog input 50, 51, 52 by the analog value of the digital information cos A, cos (A−120°0), cos (A+120°), which is applied to its digital input 44, 45, 46.

At the respective outputs 53, 54, 55 of these computation circuits, there are subsequently obtained the respective analog values of i1.cos A, i2.cos (A−120°) and i3.cos (A+120°). These three voltages are applied, through resistors 56, 57, 58 having equal values, to the inverting input 59 of a differential amplifier 60, the non-inverting input 61 of which is connected to the ground by a resistor 62: this amplifier 60 works as an adder of the three voltages given at 53, 54 and 55 so that, by the action of a standard gain-adjusting resistor 63, the voltage obtained at its output 64 is finally equal to:

$$k\ [i1.cos\ A + i2.cos\ (A+120°) + i3.cos\ (A+120°)$$

that is, ultimately, to the instantaneous value Ci of the torque on the shaft of the motor.

The measurement Ci thus obtained can be used for a variety of purposes, for example to perform measurements of the transfer function in the laboratory or in servo-systems, or to conduct tests during final adjustment trials in the laboratory or in a servo-system. It can also be used, in the manner of standard DC motors, to set up a current negative feedback loop in the context of a servo-control of a self-synchronous motor.

Figure 4:
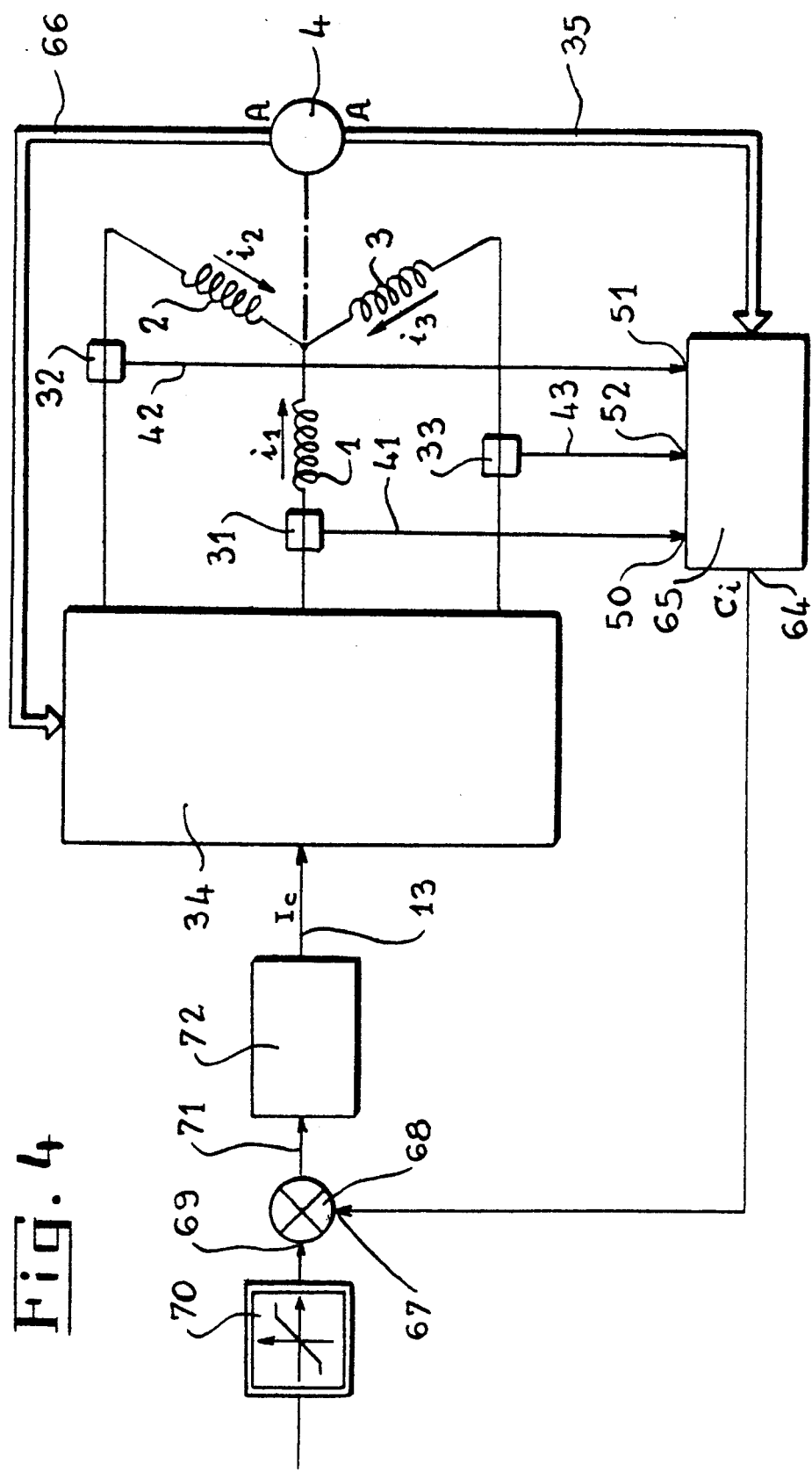
FIG. 4 is a simplified electrical diagram of a device for the servo-control of this self-synchronous motor, said control device using the torque measuring device according to FIG. 3.

An exemplary embodiment of a servo-control such as this, with a current negative feedback loop, is shown schematically in FIG. 4 in which the same reference numbers have been repeated for the elements identical to those of the preceding figures. Furthermore, with a view to simplification, a single block referenced 65 has been used to designate the entire computation circuit boxed in by dots and dashes in FIG. 3 (where it also has the reference 65 to make the explanation clearer).

It must be noted that, through a bus 66, the angle encoder 4 also gives the value of the angle A to the electronic unit 34. This electronic unit 34, in the manner of the one which, by analogy, is boxed in by dots and dashes in FIG. 1 and is also designated by the reference 34, does in fact need this information in order to carry out the desired distribution of the currents i1, i2, i3 in the stator windings 1, 2, 3.

As can be seen in this FIG. 4, the analog voltage Ci emerging at 64 from the computation unit 65 is used to set up a negative feedback loop and is consequently applied to the subtraction input 67 of a standard subtractor 68 which receives, at its other input 69, the control signal that comes, for example, from a servo-system circuit and has advantageously passed beforehand through a standard deliberate saturation device 70.

Figure 1:
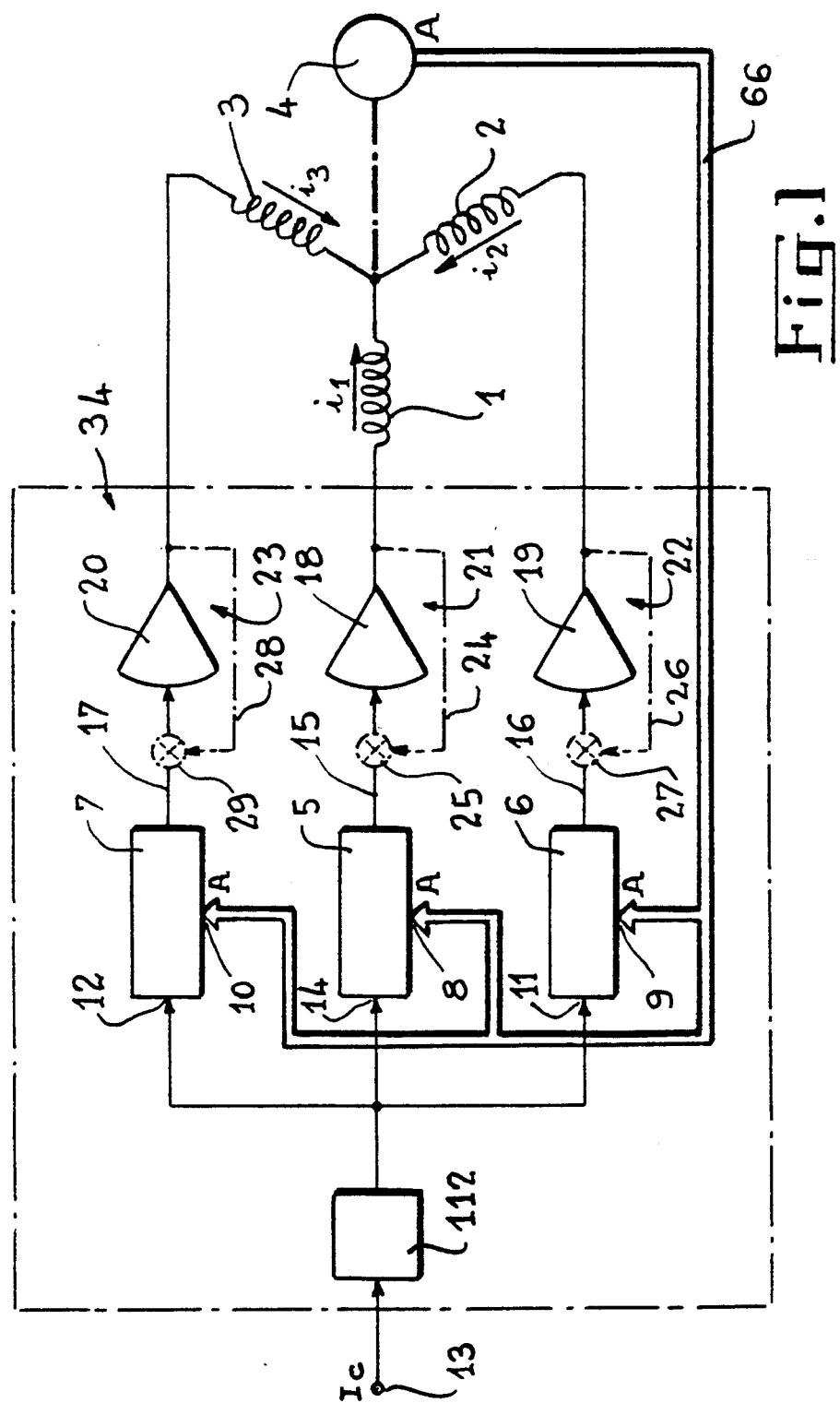
FIG. 1 shows a conventional device for the control of a self-synchronous motor.

The error signal obtained at the output 71 of the subtractor 68 is applied in a standard way to a corrector network 72 capable of mitigating the risks of instability of the assembly, and is finally applied to the electronic unit 34 (see, by analogy, FIG. 1).

It must be noted that, on its power amplifiers 18, 19, 20 (see FIG. 1), the unit 34 may have negative feedback loops 21, 22, 24 which will have the advantage of boosting the beneficial effects of the overall loop of FIG. 4. However, in a more economical approach to making the structure, it is possible to refrain from providing for such negative feedback loops 21 to 23. Following the same line of thinking, in an installation according to FIG. 4, it is also possible to provide for the a priori compensation referred to above.

Figure 5:
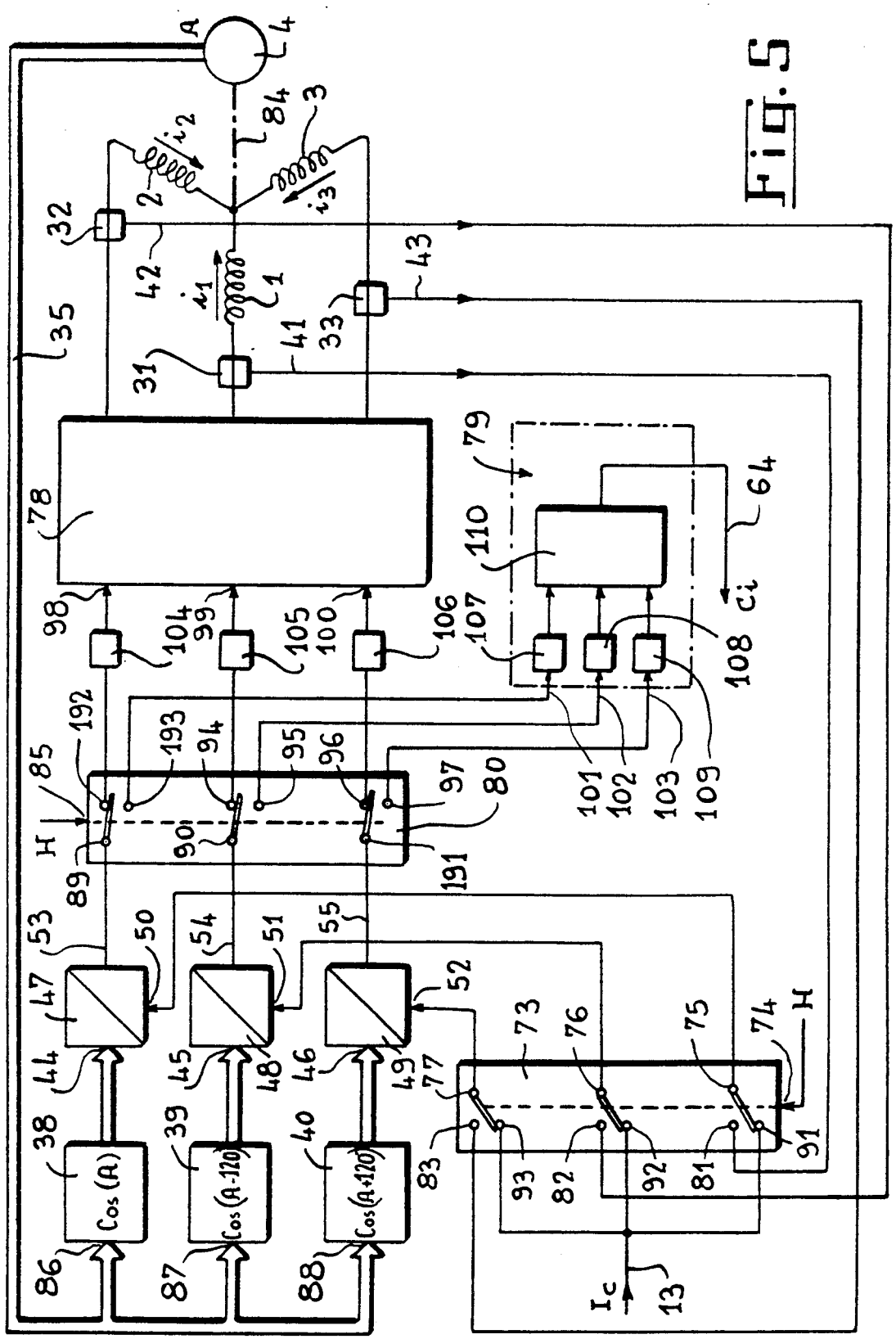
FIG. 5 is a variant of this torque measuring device.

A worthwhile variant of this device for measuring the electromagnetic torque of a self-synchronous motor is shown schematically in FIG. 5.

This embodiment is based on the observation that, in the circuit according to FIG. 3 for example, it is identical functional elements that may be used both, in the unit 65, to compute the arithmetical value of each of the projections of the vectors representing the currents i1, i2 and i3 on the APMM of the motor (and hence to compute the torque) and, in the unit 34, to split up the control current Ic (cf. explanations with reference to FIG. 1) on the three axes in order to obtain a resultant field that is parallel to APMM: in both cases, what has to be done is to compute cos A, cos (A−120°) and cos (A+120°), and to multiply each of these values obtained by an arithmetical value.

In the final analysis, it is possible, as shown in FIG. 5, to use the circuits for the computation of i1.cos A, i2.cos (A−120) and i3.cos (A+120°), that is, for example, the respective circuits (38, 47), (39, 48), and (40, 49), both in the unit 65 and in the unit 34, and to operate by multiplexing to use these circuits alternately for either unit.

In this FIG. 5, the bus 35 conveys, as in FIG. 3, the digital information representing the instantaneous value of the above-mentioned angle A towards the circuits 38, 39, 40 (the same as in FIG. 3) for the digital computation of cos A, cos (A−120°) and cos (A+120°). The items of digital information at output of these three circuits are applied, again as in FIG. 3, to the (digital-/analog) hybrid multipliers 47, 48 and 49, at the respective digital inputs 44, 45 and 46 of these multipliers.

The outputs 41, 42, 43 of the current sensors 31, 32, 33 are respectively connected to the three first input terminals 81, 82, 83 of a first electronic switch-over circuit or multiplexer 73 which is controlled at 74 by a clock signal H.

At its three corresponding second input terminals 91, 92, 93, this multiplexer receives the control parameter for the motor Ic which is applied to the wire 13 (thus referenced with a view to analogy with the circuit of FIG. 1).

The multiplexer 73 works, under the control of the switch-over signal H, like a set of three two-channel change-over switches, the three respective switched-over outputs 75, 76, 77 of which are applied to the respective analog inputs 50, 51, 52 of the hybrid multipliers 47, 48, 49.

It can thus be clearly seen that whereas, at a determined clock stroke, the three change-over switches are in the position of FIG. 5 and that, consequently, it is the value Ic that is applied between the analog inputs 50, 51, 52 of the multipliers 47, 48, 49, by contrast, at the next clock stroke which switches these three change-over switches to their initial position, it is the values measured by the sensors 31, 32, 33 of the currents i1, i2, i3 that are respectively applied to these three inputs of the multipliers 47, 48, 49. In this first position, we then obtain the respective values Ic.cos A, Ic.cos (A−120°) and Ic.cos (A+120°) at the outputs 53, 54, 55 of these multipliers 47, 48, 49 whereas, in the second position, it is the respective values i1.cos A, i2.cos (A−120°) and i3.cos (A+120°) that are obtained by these same outputs 53, 54 and 55. It is therefore really the same circuits 38/47, 39/48, 40/49 that are used to perform these two computations alternately.

Finally, in order that the analog data obtained alternately at 53, 54, 55 may be shunted alternately towards the circuit 78 for the power supply to the motor, on the one hand, and towards the remaining part 79 of the torque-measuring circuit, on the other hand, there is provision for a second electronic multiplexing circuit 80, controlled by the above-mentioned clock signal H at its control input 85 and possessing (contrary to the multiplexer 73), three input terminals 89, 90, 191 and six switched-over output terminals respectively associated, two by two, with these three input terminals, namely:
192 and 193 associated with the input terminal 89;
94 and 95 associated with the input terminal 90; and
96 and 97 associated with the input terminal 191.

Since the input terminals 89, 90, 191 are connected to the outputs 53, 54, 55 of the multipliers 47, 48, 49, the multiplexer 80 is adjusted to make the connection, to each other, of respectively the terminals 89 and 192, 90 and 94, 191 and 96 when it is (as in FIG. 5), the terminals 93 and 77, 92 and 76, 91 and 75 that are connected to each other. In the opposite case, this multiplexer 80 is adjusted to connect the terminals 89 and 193, 90 and 95, 191 and 97 to each other.

In the former case, the outputs 53, 54, 55 are connected to the inputs 98, 99, 100 of the power circuit 78. This provides for the desired supply to the stator windings 1, 2, 3. In the latter case (i.e. at the next clock stroke), they are connected to the three inputs 101, 102, 103 of the above-mentioned unit 79. This enables the computation of the torque Ci, the value of which appears at the output wire 64.

It has to be noted that three holder circuits 104, 105 and 106, respectively, are provided upstream of the above-mentioned three inputs 98, 99, 100, respectively, of the circuit 78, to prevent a loss of the signal during the time interval when the terminals 89, 90 and 91 are respectively connected to the terminals 193, 95 and 97. In the same way, the inputs 101 to 103 of the circuit 79 are respectively applied to holder circuits 107 to 109 to prevent a loss of information in the computation of the torque Ci during the next time interval when the terminals 89, 90 and 91 are respectively connected to the terminals 192, 94 and 96.

The output signals of these three holder circuits 107 and 109 are respectively applied to an adder with operational amplifier 110 which, in the manner of the circuit 56 to 63 of FIG. 3, adds them up and multiplies them by a factor of proportionality to deduce therefrom the value Ci of the torque, which is extracted at 64.

It goes without saying that the invention is not restricted to the exemplary embodiments that have just been described. It is thus that the wired circuit 65 (FIGS. 3 and 4) that computes the torque Ci by application of the formula:

$$Ci = k i1.\cos A + i2.\cos (A+120°) + i3.\cos (A+120°)$$

could be replaced by a microprocessor, for example of the digital signal processor (DSP) type, or by any other computation logic device. More precisely, it is a DSP already used, moreover, in the servo-system incorporating the motor which could thus fulfill this function. In such a case, the use, according to FIG. 5, of the same elements, to split up the vector Ic (control vector) along the three axes of the stator coils of the motor as well as to prepare the variable Ci in the form of an analog or digital signal by the addition of the three projections, on the APMM, of the three stator currents would be achieved simply by the use of the same sub-programs. In the foregoing, we have given the example of a three-phase motor (1, 2, 3). It goes without saying that it could be a two-phase motor or a motor with more than three phases.

What is claimed is:

1. A device for the dynamic measurement of the electromagnetic torque Ci of a self-synchronous motor comprising a rotor, formed by a permanent magnet associated with an axis perpendicular to the magnetic moment (APMM) of said magnet, and stator windings supplied by electronic supply means giving respective currents to said windings, said device comprising:
   first means to measure the instantaneous value of said currents in each of said stator windings;
   second means to measure the instantaneous value of at least one of the angles between the directions of the respective magnetic fields, created in each of said windings, and said axis;
   third means to compute the cosine of each of said respective angles and to multiply said cosines respectively by said instantaneous values of said corresponding currents, so as to obtain the arithmetical values of the respective projections, on said axis, of the vectors representing, in the electrical plane of said motor, said respective stator currents; and
   fourth means to add up said arithmetical values given by said third means and to multiply the sum thus obtained by a predetermined factor of proportionality to obtain the instantaneous value of said electromagnetic torque.

2. A measurement device according to claim 1, wherein said second means include a device for digital encoding one of said angles between the direction of the magnetic field created in one of said windings and said axis, wherein said third means include devices for computation of said cosines from the instantaneous value of said angle given by said encoding device, and digital-/analog multiplication circuits, each having a digital signal input to receive the cosine value given by said respective computation devices, an analog signal input to receive the instantaneous value of said respective currents given by said first means and an output giving said arithmetical values, and wherein said fourth means include an analog circuit for the addition and multiplication of said sum by said predetermined factor of proportionality.

3. A measurement device according to claim 1, wherein said third and fourth means are formed by a logic computation device.

4. A measurement device according to claim 2, further comprising first multiplexing means, having a plurality of outputs respectively connected to said analog signal inputs of said digital/analog multiplication circuits, a first plurality of inputs receiving a control current for said motor and a second plurality of inputs receiving respectively said instantaneous values of the currents given by said first means, and second multiplexing means, having a plurality of inputs respectively connected to the outputs of said digital/analog multiplication circuits, a first plurality of outputs connected to a circuit for the power supply to said stator windings of the motor and a second plurality of outputs connected to said fourth means, so as to enable the alternating use of said stator currents and to compute the instantaneous value of said electromagnetic torque of the motor.

5. A measurement device according to any one of the claims 1 to 4, wherein said measurement device is used together with a servo-control device for controlling the self-synchronous motor, said servo-control device includes a current negative feedback loop to give a control current to the electronic supply means of said measurement device, said measurement device being inserted in said current negative feedback loop.

* * * * *